(12) United States Patent
Tokai

(10) Patent No.: US 6,696,858 B2
(45) Date of Patent: Feb. 24, 2004

(54) LEVEL-SHIFTING CIRCUIT

(75) Inventor: Yoichi Tokai, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 257 days.

(21) Appl. No.: 09/945,817

(22) Filed: Sep. 5, 2001

(65) Prior Publication Data

US 2002/0027450 A1 Mar. 7, 2002

(30) Foreign Application Priority Data

Sep. 5, 2000 (JP) ........................................ 2000-268849

(51) Int. Cl.[7] ......................................... H03K 19/0175
(52) U.S. Cl. ............................. 326/68; 326/73; 326/74; 326/75; 326/77; 326/78
(58) Field of Search ............................. 326/63–81, 115, 326/126, 127

(56) References Cited

U.S. PATENT DOCUMENTS

| | | | |
|---|---|---|---|
| 4,150,308 A | | 4/1979 | Adlhoch |
| 4,486,670 A | | 12/1984 | Chan et al. |
| 5,272,389 A | | 12/1993 | Hatada |
| 5,502,405 A | * | 3/1996 | Williams ...................... 326/66 |
| 6,008,667 A | * | 12/1999 | Fahrenbruch ................ 326/66 |

* cited by examiner

*Primary Examiner*—Anh Tran
(74) *Attorney, Agent, or Firm*—Oblon, Spivak, McClelland, Maier & Neustadt, P.C.

(57) ABSTRACT

A semiconductor integrated circuit device includes a level-shifting circuit, a current mirror circuit and a switch circuit. The level-shifting circuit level-shifts an input signal having a first amplitude to an output signal having a second amplitude. The current mirror circuit charges or discharges an output node of the level-shifting circuit. The switch circuit operates the current mirror circuit during a period from the inversion of the input signal to the inversion of the output signal.

14 Claims, 14 Drawing Sheets

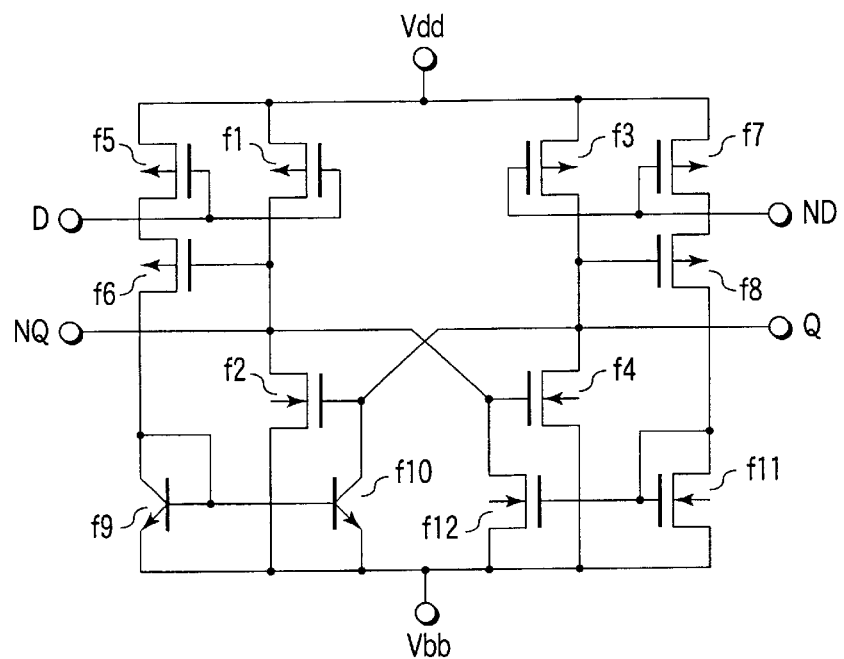
F I G. 10
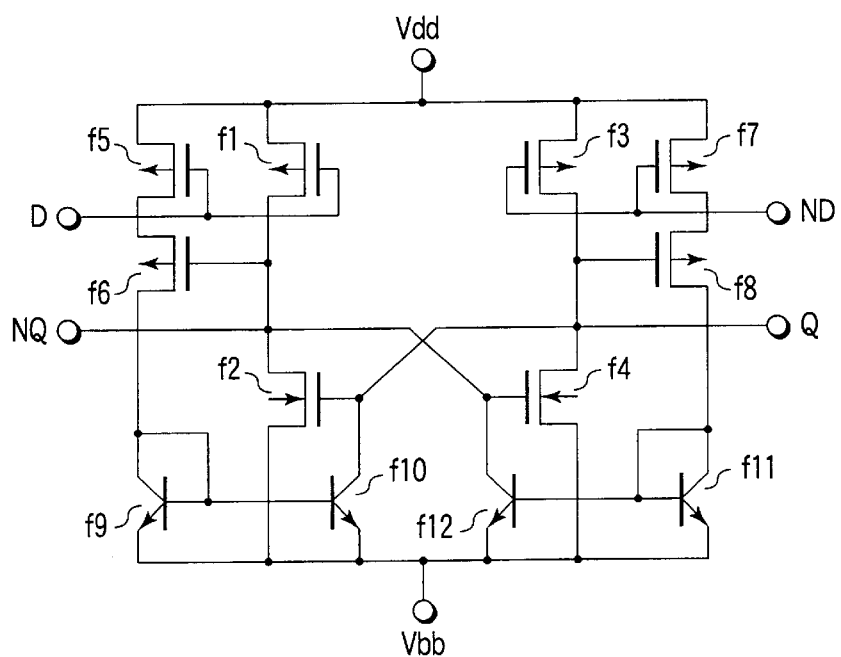
F I G. 11

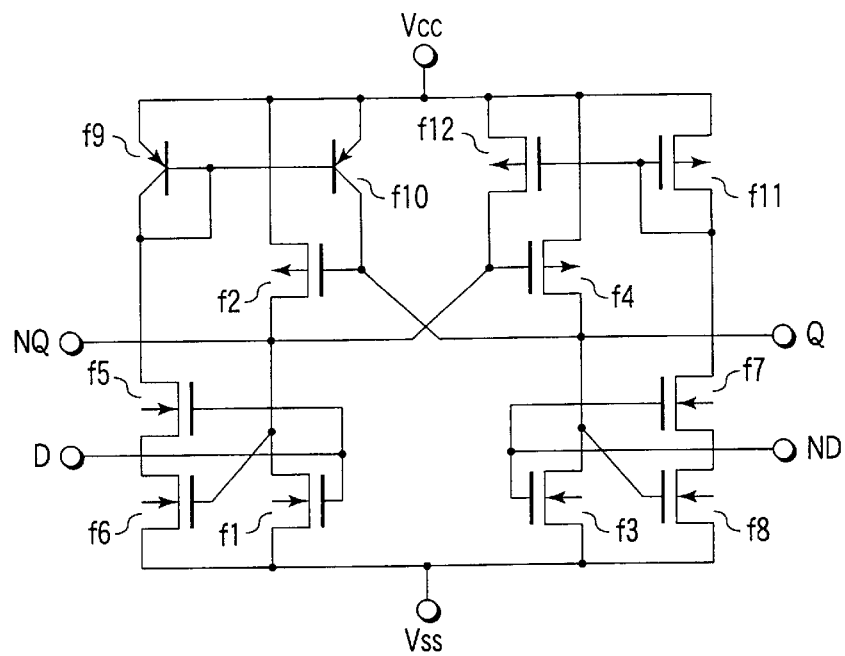
F I G. 12
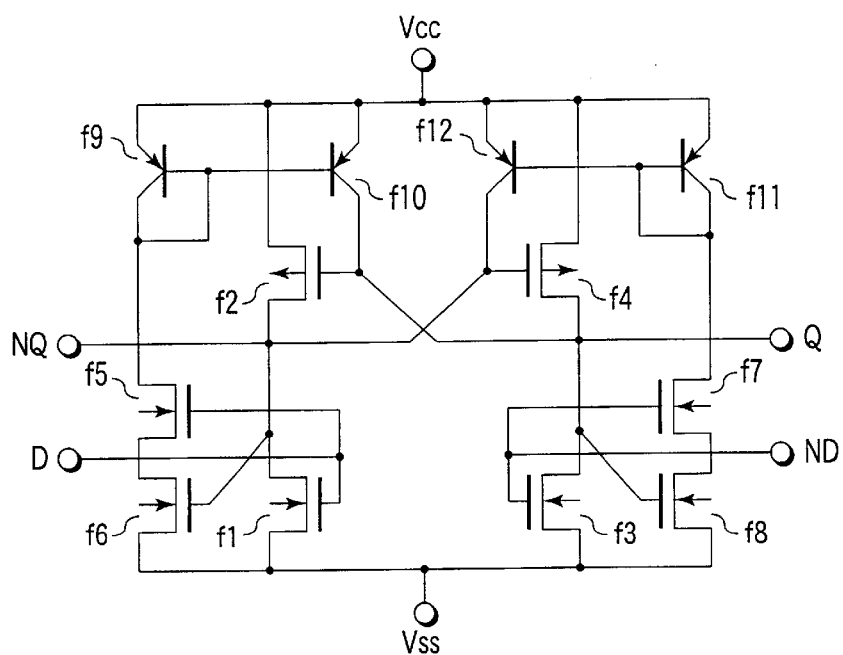
F I G. 13

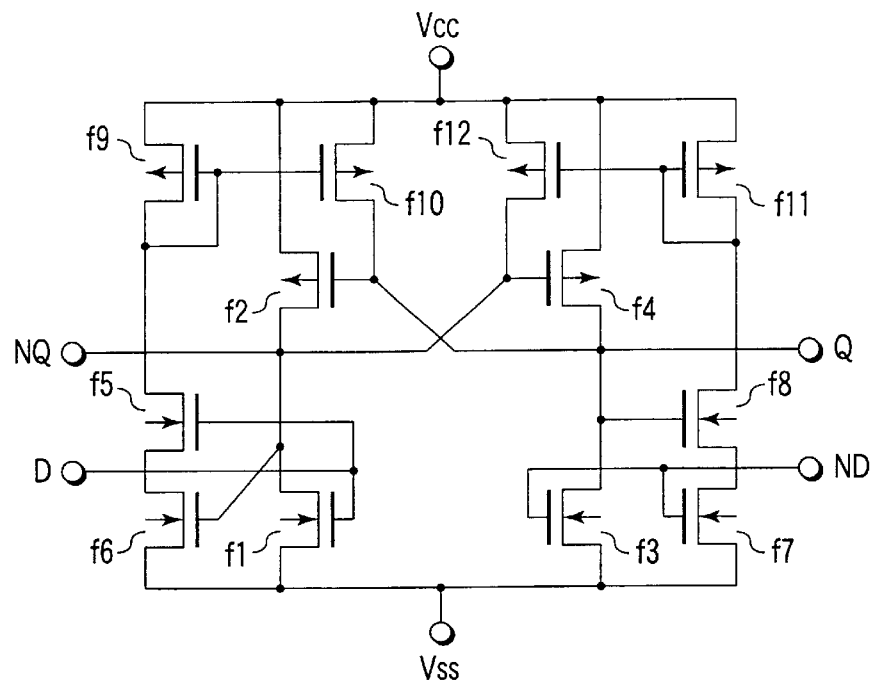
F I G. 16
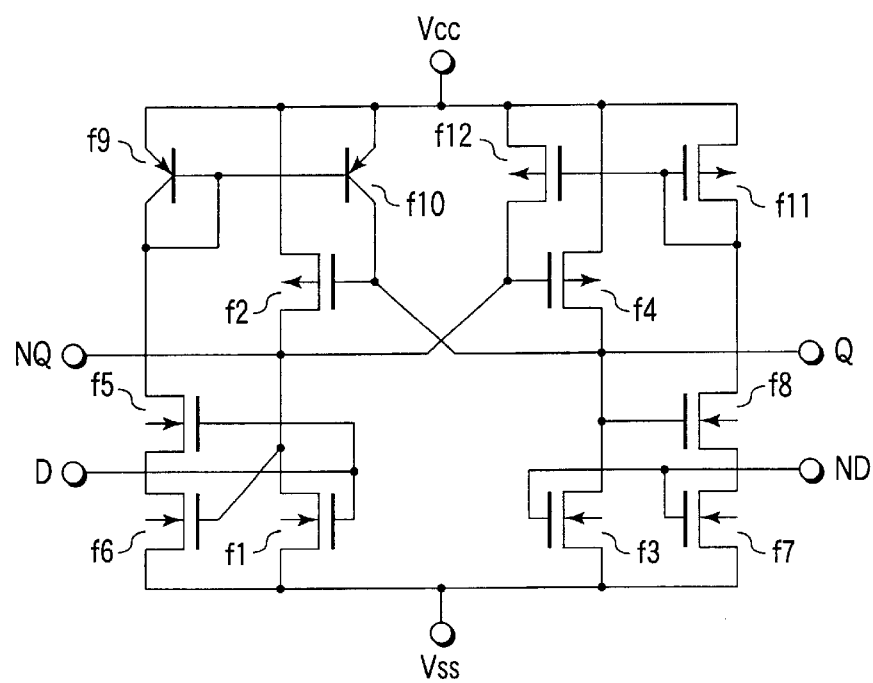
F I G. 17

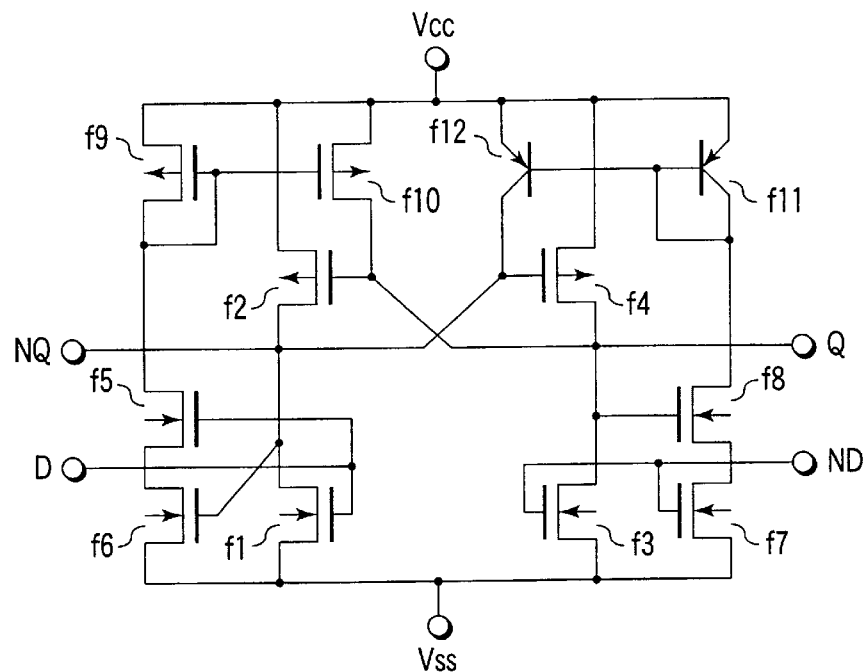
F I G. 18
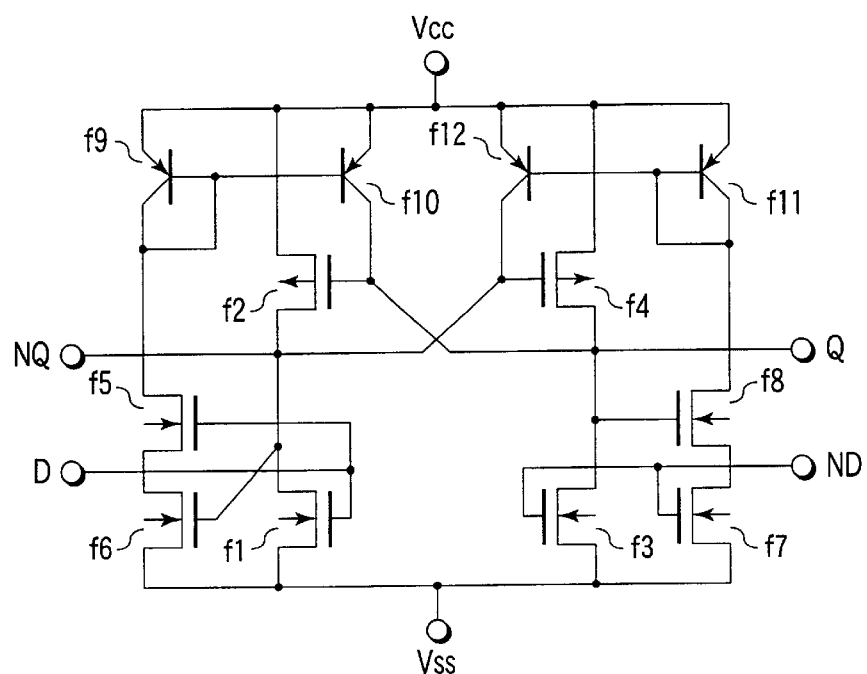
F I G. 19

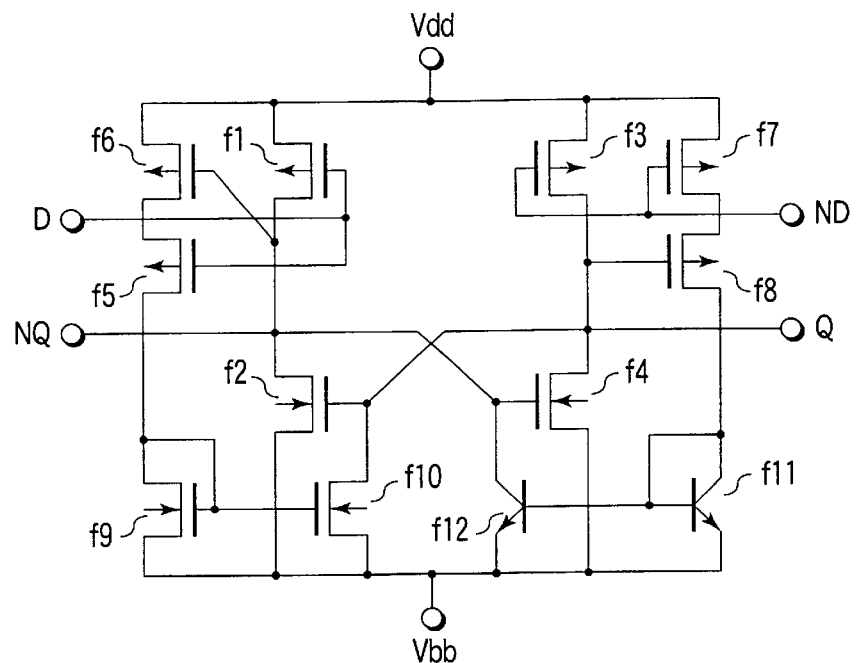
F I G. 22
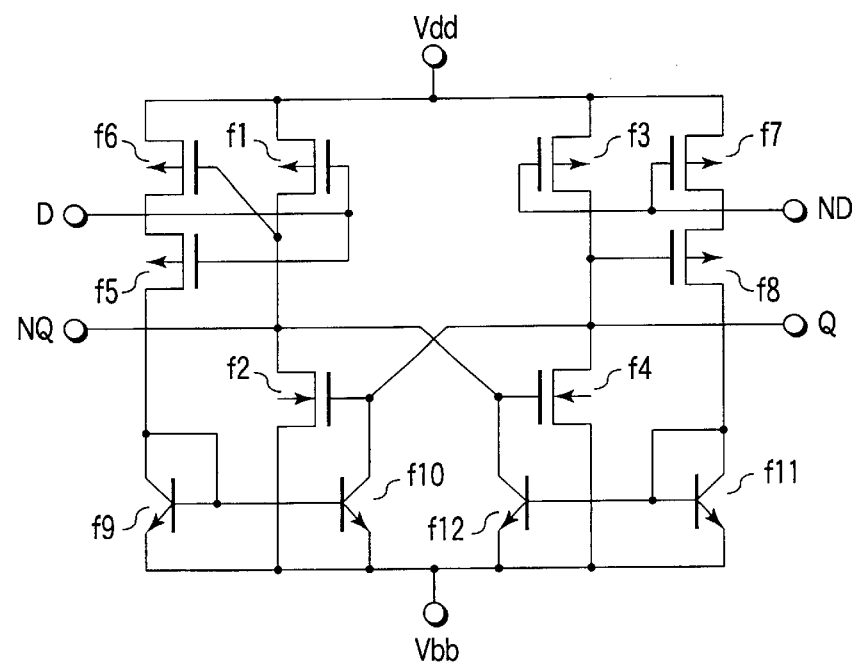
F I G. 23

LEVEL-SHIFTING CIRCUIT

CROSS-REFERENCE TO RELATED APPLICATIONS

This application is based upon and claims the benefit of priority from the prior Japanese Patent Application No. 2000-268849, filed Sep. 5, 2000, the entire contents of which are incorporated herein by reference.

BACKGROUND OF THE INVENTION

1. Field of the Invention

This invention relates to a semiconductor integrated circuit device, more particularly, to a level-shifting circuit.

2. Description of the Related Art

FIG. 24 is a circuit diagram showing a conventional level-shifting circuit (4-transistor type).

As shown in FIG. 24, the level-shifting circuit is constituted by input side NMOS f1 and f3 for receiving input signals D, ND (ND is a complementary signal of D), output side PMOS f4 cascade connected to the NMOS f1, and output side PMOS f2 cascade connected to the NMOS f3.

The inverse operation of such level-shifting circuit is terminated by inverting drain voltage (output signal Q) of the NMOS f3, and drain voltage (output signal NQ; NQ is a complementary signal of Q) of the NMOS f1, respectively, and inverting ON/OFF of the PMOS f4 receiving an output signal Q and the PMOS f2 receiving an inverted output signal NQ in a gate thereof. In this inverse operation, especially in its initial stage, the drain current of the part to become ON by inversion out of the drain currents of NMOS f1, f3, is required to be sufficiently larger than the drain current of the part to become OFF by inversion out of the drain currents of PMOS f2, f4.

Specifically, in the initial stage of the inverse operation, at least the following condition (1) is required between drain current Id1 of the NMOS f1 (or f3) and drain current Id2 of the PMOS f4 (or f2) cascade connected to the drain current Id1:

$$|Id1(Vgs=Vdd-Vss)| > |Id2(Vgs=Vss-vcc)| \quad (1)$$

In other words, under the following condition (2), the level-shifting circuit is not operated.

$$|Id1(Vgs=Vdd-Vss)| \leq |Id2(Vgs=Vss-vcc)| \quad (2)$$

For example, in case the maximum voltage vdd of the input signals D, ND is reduced to the level near threshold voltage of the NMOS f1, f3, the drain current Id1 of the NMOS f1 (or f3) decreases to make it difficult to satisfy the above condition (1) and the level-shifting circuit may not be operated.

Thus, in order to have the level-shifting circuit operate sufficiently, the above condition (1) is required to be satisfied.

In case the maximum voltage Vcc (Vcc>vdd) of the output signals Q, NQ is elevated, the drain current Id2 of the PMOS f4 (or f2) increases to make it difficult to satisfy the above condition (1) similarly and the level-shifting circuit may not be operated.

Accordingly, conventionally there has been a contrivance made to enlarge element sizes of the NMOS f1, f3, and the PMOS f2, f4, in order to satisfy the condition (1) above. For example, in the NMOS f1, f3, its gate width W is increased, and in the PMOS f2, f4, its gate length L is increased. By this step, the driving capacity of the NMOS f1, f3 is enhanced, and the drain current Id1 is enlarged. On the contrary, the drain current Id2 can be reduced.

Further, in order to satisfy the condition (1) above, a 6-transistor type level-shifting circuit as shown in FIG. 25 is contrived.

In the 6-transistor type level-shifting circuit as shown in FIG. 25, PMOS f13 or PMOS f14 suppresses the supply of the potential to the source of PMOS f12 or PMOS f14 in the initial stage of the inverse operation. For this reason, this transistor may have the drain current in the initial stage of the inverse operation smaller than that of the 4-transistor type level-shifting circuit shown in FIG. 24.

In the conventional level-shifting circuit, there may be the situation such that, in case the voltage ratio "Vcc/Vdd" between the voltage Vdd prior to the level-shifting and the voltage Vcc after the level-shifting is made larger by lowering the voltage Vdd of the input signals D, ND or elevating the voltage Vcc of the output signals Q, NQ, the level-shifting circuit fails to operate.

Accordingly, in order to dissolve this situation, contrivance is made to enlarge the element size of MOSFET which constitutes the level-shifting circuit.

However, in the field of the semiconductor integrated circuit device, there is a requirement of micronization and high integration, and there is a limit to satisfy the condition (1) described above only by the contrivance of enlarging the element size of the MOSFET.

Besides, contrivance is made of the 6-transistor type level-shifting circuit. In this 6-transistor type level-shifting circuit, in comparison with the 4-transistor type level-shifting circuit, the drain current Id2 in the initial stage of the inverse operation can be minimized to make it easier to satisfy the above condition (1).

However, as the 6-transistor type level-shifting circuit basically only suppresses the supply of the electric current to the source of the PMOS f4 or f2 in the initial stage of the inverse operation, there remains a limit.

BRIEF SUMMARY OF THE INVENTION

A semiconductor integrated circuit device according to an embodiment of the present invention comprises: a level-shifting circuit configured to level-shift an input signal having a first amplitude to an output signal having a second amplitude different from the first amplitude, the level-shifting circuit having an input node in which the input signal is inputted and an output node in which the output signal is outputted; a current mirror circuit configured to charge or discharge the output node; and a switch circuit configured to operate the current mirror circuit during a period from the inversion of the input signal to the inversion of the output signal.

BRIEF DESCRIPTION OF THE SEVERAL VIEWS OF THE DRAWING

FIG. 10 is a circuit diagram showing a level-shifting circuit according to a seventh embodiment of the invention;

FIG. 11 is a circuit diagram showing a level-shifting circuit according to an eighth embodiment of the invention;

FIG. 12 is a circuit diagram showing a level-shifting circuit according to a ninth embodiment of the invention;

FIG. 13 is a circuit diagram showing a level-shifting circuit according to a tenth embodiment of the invention;

FIG. 16 is a circuit diagram showing a level-shifting circuit according to a thirteenth embodiment of the invention;

FIG. 17 is a circuit diagram showing a level-shifting circuit according to a fourteenth embodiment of the invention;

FIG. 18 is a circuit diagram showing a level-shifting circuit according to a fifteenth embodiment of the invention;

FIG. 19 is a circuit diagram showing a level-shifting circuit according to a sixteenth embodiment of the invention;

FIG. 22 is a circuit diagram showing a level-shifting circuit according to a nineteenth embodiment of the invention;

FIG. 23 is a circuit diagram showing a level-shifting circuit according to a twentieth embodiment of the invention;

DETAILED DESCRIPTION OF THE INVENTION

Figure 1:
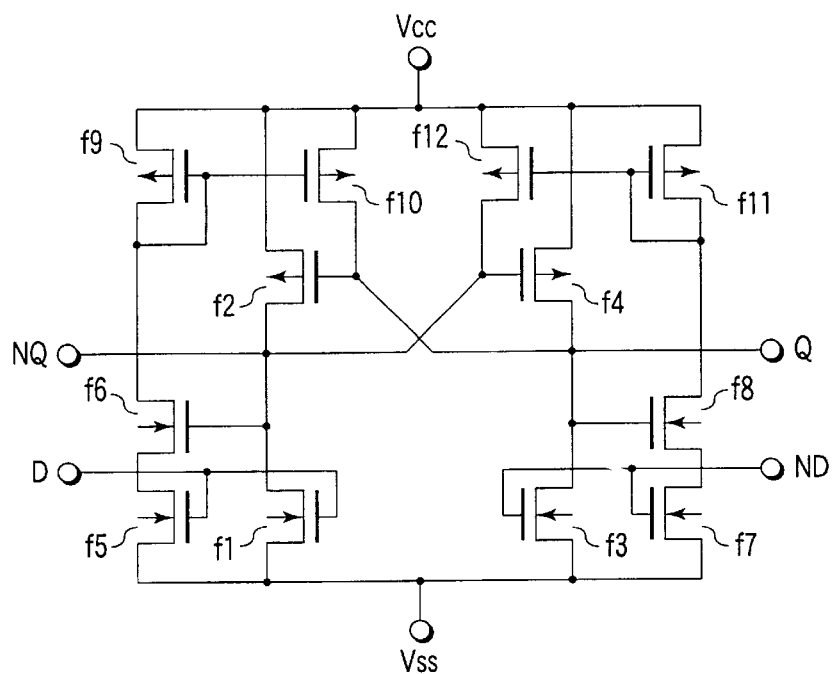
FIG. 1 is a circuit diagram showing a level-shifting circuit according to a first embodiment of the invention.

Hereinafter, several embodiments of the invention will be explained with reference to the accompanying drawings. In connection with this explanation, throughout the drawings, common portions are indicated with the same reference numerals.

(First Embodiment)

FIG. 1 is a circuit diagram showing a level-shifting circuit according to the first embodiment of the invention.

As shown in FIG. 1, transistors f1, f2, f3, and f4 constitute a level-shifting circuit for level shifting to output signals Q, NQ having an amplitude of Vss–Vcc level for input signals D, ND having an amplitude of Vss–Vdd level. The potential Vcc is a high potential power source, the potential Vss is a low potential power source (e.g., 0 V), and the potential Vdd is an interim potential between the potential Vcc and the potential Vss. The input signal ND is a complementary input signal which is complementary to the input signal D, e.g., a reversed phase signal of the input signal D, or an inverse signal to the input signal D inverted by an inverter. The output signal NQ is a complementary output signal complementary to the output signal Q, e.g., a reversed phase signal of the output signal Q.

In the first embodiment of the invention, the transistors f1, f3 are constituted by an N-channel type MOSFET (hereinafter to be abbreviated as NMOS), respectively, and the transistors f2, f4 are constituted by a P-channel type MOSFET (hereinafter to be abbreviated as PMOS), respectively.

Specifically, as shown in FIG. 1, the low potential power source Vss is supplied to the source of the NMOS f1, and the input signal D is supplied to its gate. Also, its drain is electrically connected to the complementary output node to which the complementary output signal NQ is outputted (hereinafter to be referred to as complementary output node NQ, for convenience).

The low potential power source Vss is supplied to the source of the NMOS f3, and the complementary input signal ND is supplied to its gate. Also, its drain is electrically connected to an output node to which the complementary output signal Q is outputted (hereinafter to be referred to as output node Q, for convenience).

The high potential power source Vcc is supplied to the source of the PMOS f2, its gate is electrically connected to the output node Q, and its drain is connected to the complementary output node NQ.

The high potential power source Vcc is supplied to the source of the PMOS f4, its gate is electrically connected to the complementary output node NQ, and its drain is connected to the output node Q.

Transistors f9, f10 constitute a current mirror circuit to charge the output node Q. Similarly, transistors f11, 12 constitute a current mirror circuit to charge the complementary output node NQ.

In this first embodiment, the transistors f9 to f12 are constituted by PMOS, respectively.

Specifically, as shown in FIG. 1, the high potential power source Vcc is supplied to the source of the PMOS f9, and its gate and drain are mutually short-circuited.

The high potential power source vcc is supplied to the source of the PMOS f10, its gate is electrically connected to the gate of the PMOS f9, and its drain is electrically connected to the output node Q.

The high potential power source Vcc is supplied to the source of the PMOS f11, and its gate and drain are mutually short-circuited.

The high potential power source vcc is supplied to the source of the PMOS f12, its gate is electrically connected to the gate of the PMOS f11, and its drain is electrically connected to the complementary output node NQ.

The transistors f5, f6 constitute a switch circuit for operating the current mirror circuit constituted by the PMOS f9 and PMOS f10 during the period from the inversion of the input signal D from Vss to Vdd to the inversion of the complementary output signal NQ from Vcc to Vss.

Similarly, the transistors f7, f8 constitute a switch circuit for operating the current mirror circuit constituted by the PMOS f11 and PMOS f12 during the period from the inversion of the complementary input signal ND from Vss to Vdd to the inversion of the output signal Q from Vcc to Vss.

In this first embodiment, the transistors f5 to f8 are constituted by NMOS, respectively.

Specifically, as shown in FIG. 1, the low potential power source Vss is supplied to the source of the NMOS f5, and the input signal D is supplied to its gate.

The source of the NMOS f6 is electrically connected to the drain of the NMOS f5, its gate is electrically connected to the complementary output node NQ, and its drain is electrically connected to the drain of the PMOS f9.

The low potential power source Vss is supplied to the source of the PMOS f7, and the complementary input signal ND is supplied to its gate.

The source of the NMOS f8 is electrically connected to the drain of the NMOS f7, its gate is electrically connected to the output node Q, and its drain is electrically connected to the drain of the PMOS f11.

Now, its basic operation will be explained.

First, as an initial state, there is assumed a condition where the potential of the input signal D is "Vss", and the potential of the complementary input signal ND is "Vdd". Under this initial state, the NMOS f1 of the level-shifting circuit is "OFF", and the NMOS f3 is "ON". Accordingly, the potential of the output node Q is approximately "Vss", and the potential of the complementary output node NQ is "Vcc". In the switch circuit, the NMOS f5 is "OFF", the NMOS f6 is "ON", the NMOS f7 is "ON", and the NMOS f8 is "OFF".

From this initial state, the potentials of the input signals D and ND are inverted, respectively.

Then, at first, the NMOS f5 of the switch circuit is turned "ON". Here, in the initial stage of the inverse operation, the potential of the complementary output node NQ maintains approximately "Vcc", so that the NMOS f6 of the switch circuit remains "ON".

In this manner, in consequence of both the NMOS f5 and f6 being turned "ON", the PMOS f9, f10 of the current mirror circuit are turned "ON", and the current mirror circuit starts to operate. Through the operation of the current mirror circuit, the output node Q is charged. In response to this, the PMOS f2 of the level-shifting circuit is turned "OFF".

At this time, because the NMOS f1 of the level-shifting circuit is "ON", the complementary output node NQ is discharged, and the potential of the complementary output node NQ is lowered toward "Vss". In response to this, the PMOS f4 of the level-shifting circuit is turned "ON" to charge the output node Q. Because of this, the potential of the node Q rises toward "Vcc".

Furthermore, when the potential of the complementary output node NQ is lowered to a level equal to or lower than the threshold of the NMOS f6 of the switch circuit, this NMOS f6 is turned "OFF" to cause the PMOS f9, f10 of the current mirror circuit to be "OFF", respectively. As a result, the operation of the current mirror circuit is stopped.

In the above explanation on the operation, assumption is made on the case of inverting the potential of the input signal D from "Vss" to "Vdd". However, in case the potential of the input signal D is inverted from "Vdd" to "Vss", the switch circuit constituted by the NMOS f7, f8 is turned "ON" to operate the current mirror circuit constituted by the PMOS f11, f12 to charge the complementary output node NQ in "Vcc". And, when the potential of the output node Q is lowered to a level equal to or lower than the threshold of the NMOS f8 of the switch circuit, this NMOS f8 is turned "OFF" to stop the operation of the current mirror circuit constituted by the PMOS f11, f12.

In the level-shifting circuit according to the first embodiment described above, in the initial stage of the inverse operation, the output node Q or complementary output node NQ is charged by the current mirror circuit. By doing so, the PMOS f2 or f4 of the level-shifting circuit is caused to turn "OFF". Therefore, the maximum voltage ratio "(Vcc−Vss)/(Vdd−Vss)" of the output voltage amplitude to the input voltage amplitude where the operation can be made sufficiently is larger than a conventional level-shifting circuit.

Furthermore, in the current mirror circuit, after inversion of the potentials of the output node Q and complementary output node NQ, respectively, the operation is stopped by the switch circuit. As a result, the current consumption at the current mirror can be suppressed.

Figure 2:
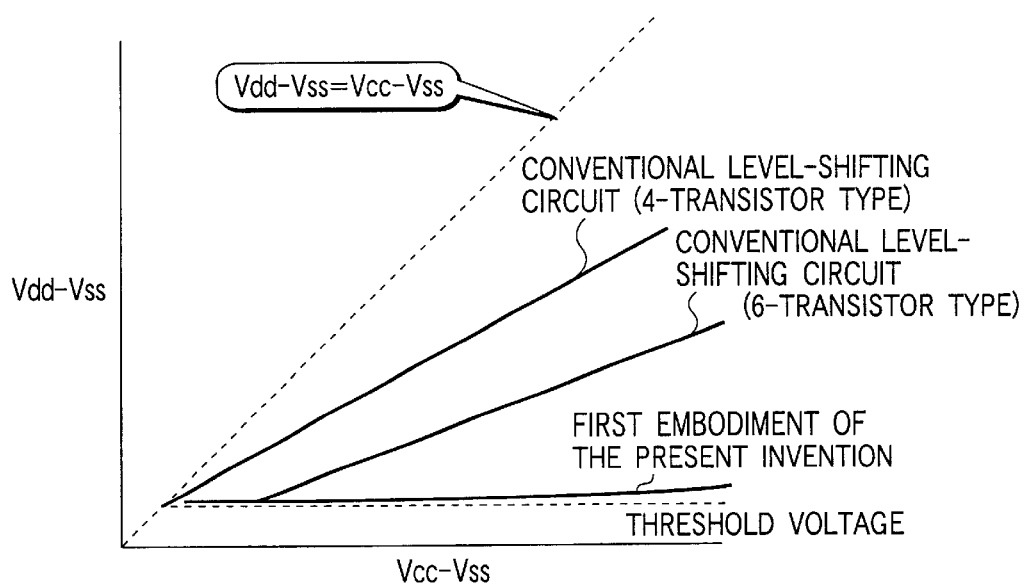
FIG. 2 is a graph showing the effects by the level-shifting circuit according to the first embodiment of the invention.
Figure 24:
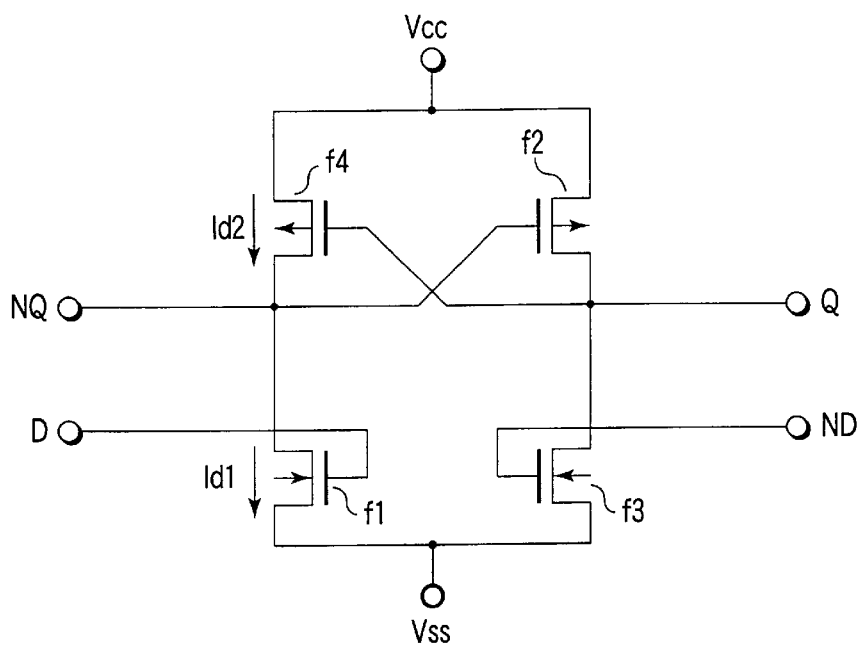
FIG. 24 is a circuit diagram showing a conventional level-shifting circuit (4-transistor type)
Figure 25:
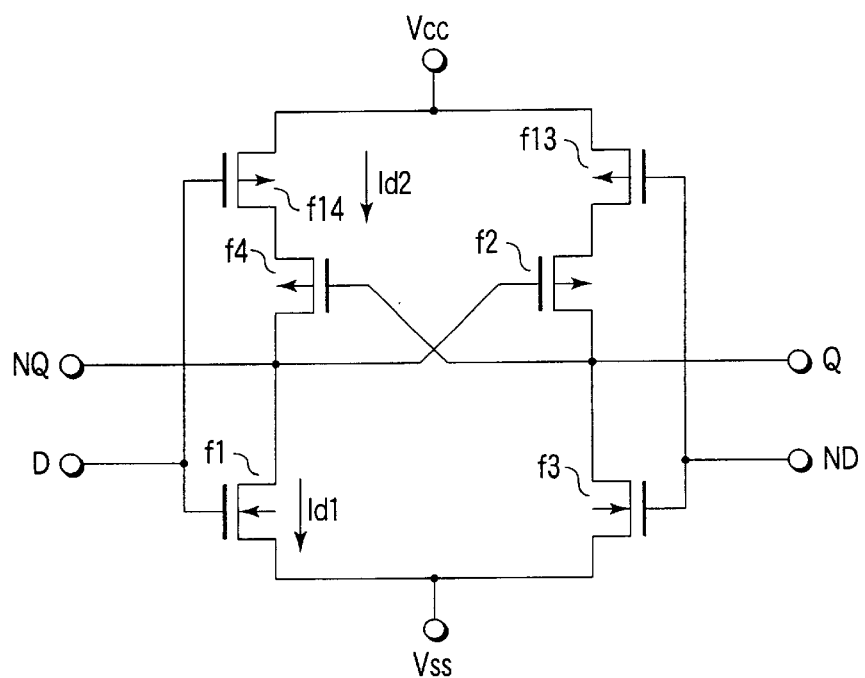
FIG. 25 is a circuit diagram showing a conventional level-shifting circuit (6-transistor type)

FIG. 2 is a graph showing by comparison the minimum input amplitude of the level-shifting circuit according to the first embodiment of the invention with the minimum input amplitude of a conventional level-shifting circuit shown in FIG. 24 and FIG. 25.

As shown in FIG. 2, in the level-shifting circuit of the invention, even when the input voltage amplitude is lowered to a level near the thresholds of the NMOS f2, f3, operation can be made sufficiently.

Though, in this first embodiment, the input signal D is supplied to the gates of the NMOS f1, f5, respectively, it may be so constituted as to supply a delayed input signal with delay of input signal D to the gate of the NMOS f1. In the same manner, to the gate of the NMOS f3, a delayed complementary input signal with delay of the complementary input signal ND may be supplied.

The effect by this is that, by delaying the switching "ON" of, for example, the NMOS f1, f3 of the level-shifting circuit further than "ON" of the NMOS f5, f7 of the switch circuit, the NMOS f6, f8 can be switched "ON" with higher reliability especially in the initial stage of the inverse operation and the current mirror circuit can be more reliably operated.

Further, in the delay of the input signal D and the complementary input signal ND, the delay time for inversion from Vss to Vdd may be set to be longer than the delay time for inversion from Vdd to Vss.

By doing so, there can be obtained a period in which the input signal D and the complementary input signal ND become simultaneously Vss, respectively, for example, a period in which the NMOS f1, f3 are simultaneously "OFF" can be obtained. Thus, it is possible to eliminate, for example, a period in which the NMOS f1, f3 are simultaneously "ON", and reduce the throughout current that flows through the period of simultaneously "ON". By the decrease of the throughout current, increase in power consumption in the integrated circuit is suppressed, being contributory to making the integrated circuit low power consumptive.

Figure 3A:
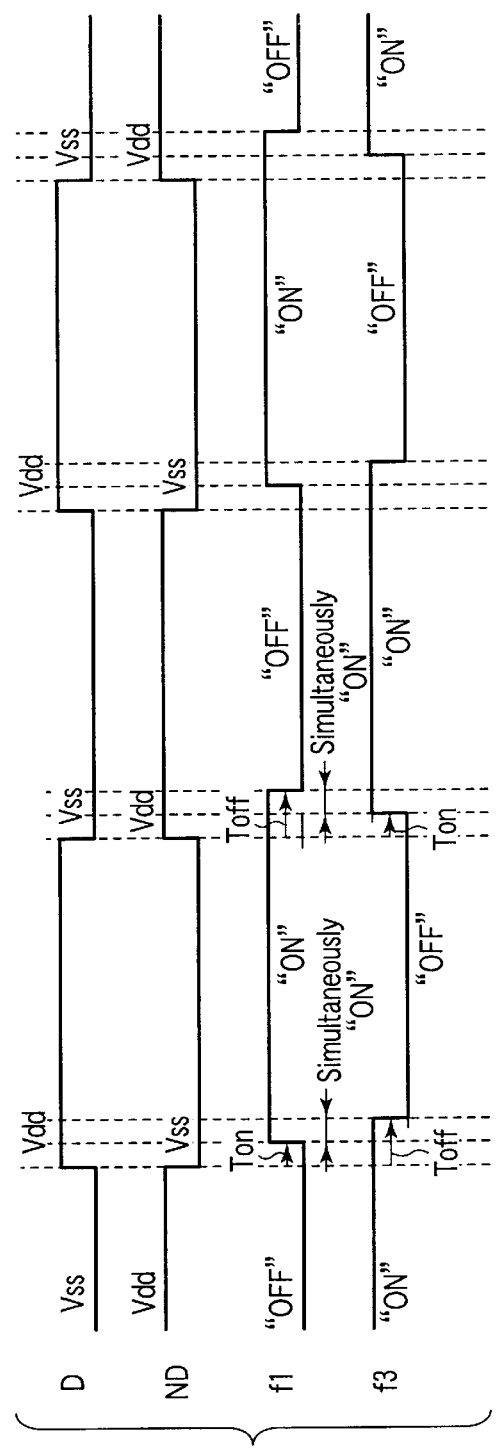
FIGS. 3A and 3B are signal waveform diagrams, respectively.

In FIG. 3A, there is shown a typical signal waveform of a level-shifting circuit that has a period in which the NMOS f1 and f3 are simultaneously "ON".

As shown in FIG. 3A, it is assumed that neither the input signal D nor the complementary input signal ND has any delay time. If, at this time, NMOS f1 and f3 have the characteristics in which the turn-off time Toff is longer than the turn-on time Ton, respectively, there is occurred a period in which the NMOS f1 and f3 are simultaneously "ON". In this period, the throughout current runs to cause unnecessary consumption of current.

Figure 3B:
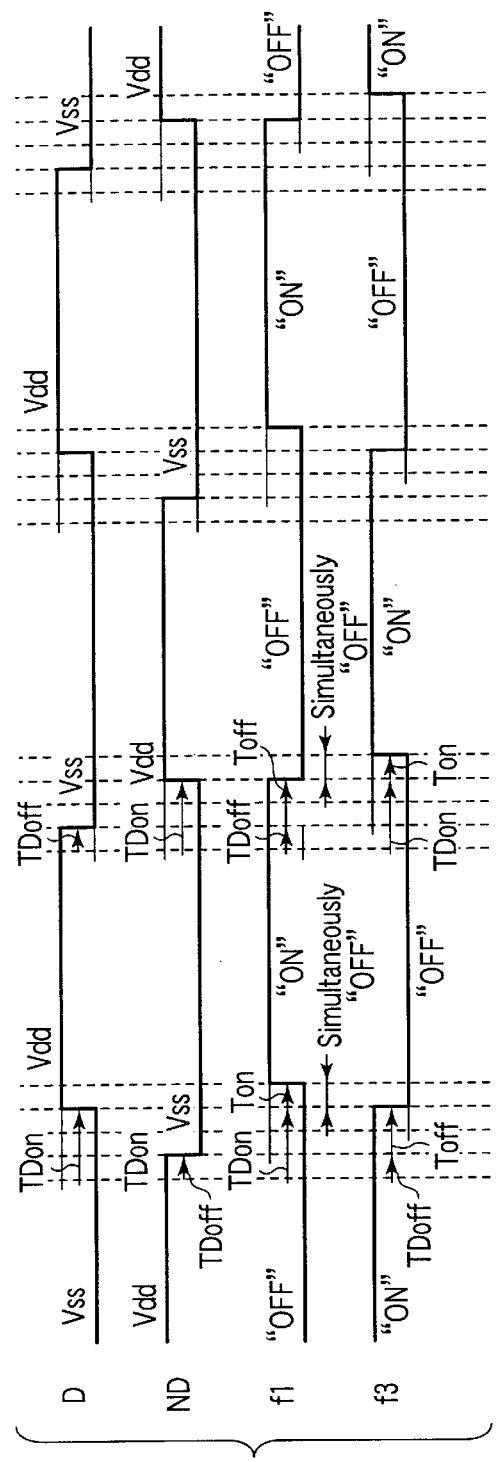

On the contrary, as shown in FIG. 3B, in the input signal D and the complementary input signal ND, the delay time TDon for inversion from Vss to Vdd and the delay time TDoff for inversion from Vdd to Vss are respectively set to satisfy the following equation:

$$TDon + Ton - (TDoff + Toff) > 0$$

In this manner, by setting the delay times TDon and TDoff for the input signal D and the complementary input signal ND, as shown in FIG. 3B, the period in which the NMOS f1 and f3 are simultaneously "ON" can be made nil to suppress unnecessary current consumption.

(Second Embodiment)

Figure 4:
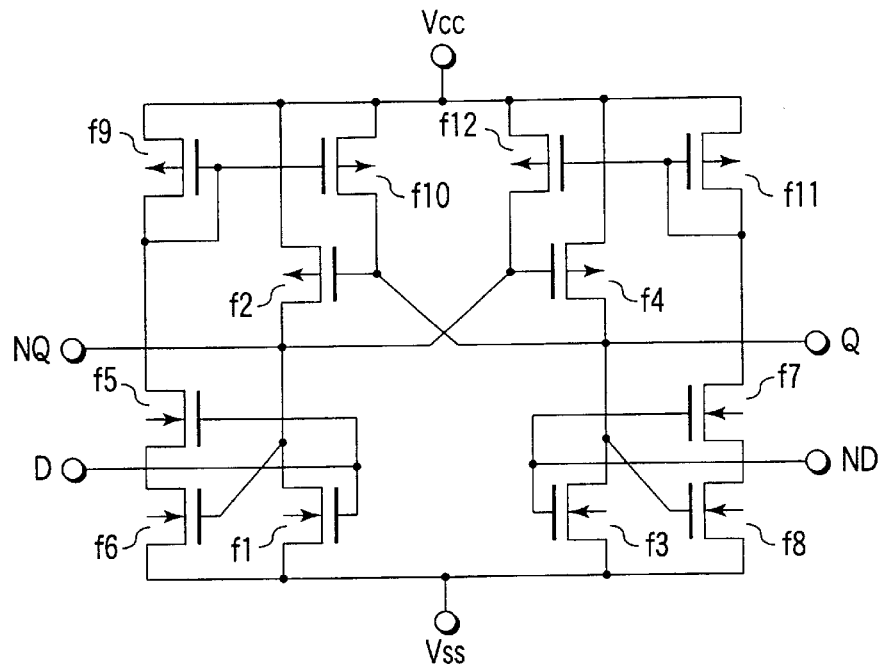
FIG. 4 is a circuit diagram showing a level-shifting circuit according to a second embodiment of the invention.

FIG. 4 is a circuit diagram showing a level-shifting circuit according to the second embodiment of the invention.

As shown in FIG. 4, the difference of the second embodiment from the first embodiment shown in FIG. 1 is in the connecting condition of NMOS f5, f6, f7 and f8 constituting the switch circuit. In the first embodiment, the NMOS f5, f7 are connected to the low potential power source Vss side, but, as shown in this second embodiment, the NMOS f6, f8 may be connected to the low potential power source Vss side.

In such second embodiment, there can be obtained the same effects as those of the first embodiment.

(Third Embodiment)

Figure 5:
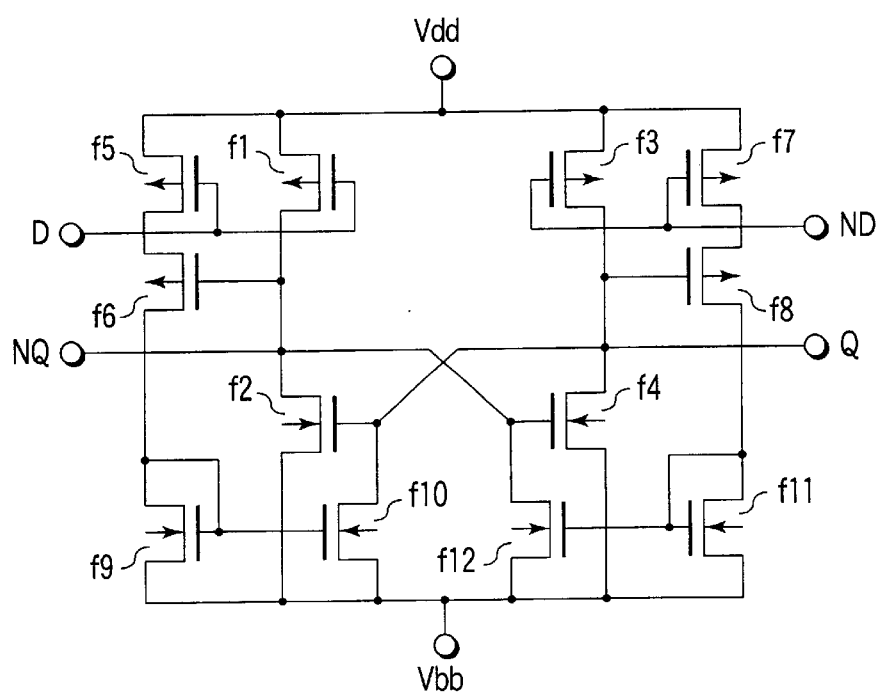
FIG. 5 is a circuit diagram showing a level-shifting circuit according to a third embodiment of the invention.

FIG. 5 is a circuit diagram showing a level-shifting circuit according to the third embodiment of the invention.

As shown in FIG. 5, the third embodiment is different from the first embodiment shown in FIG. 1 in that all the conductive types of the transistors f1 to f12 are changed to make the high potential power source Vcc to Vdd, and the low potential power source Vss to Vbb (Vbb<Vss; Vbb is for example a negative potential). The level-shifting circuit of this embodiment causes the input signals D, ND having amplitudes of Vss–Vdd level to level-shifting to the output signals Q, NQ having amplitudes of Vbb–Vdd level.

Specifically, as shown in FIG. 5, the high potential power source Vdd is supplied to the source of the PMOS f1, and the input signal D is supplied to its gate. Also, its drain is electrically connected to the complementary output node NQ.

The high potential power source Vdd is supplied to the source of the PMOS f3, and the complementary input signal ND is supplied to its gate. Further, its drain is electrically connected to the output node Q.

The low potential power source Vbb is supplied to the source of the NMOS f2, its gate is electrically connected to the output node Q, and its drain is electrically connected to the complementary output node NQ.

The low potential power source Vbb is supplied to the source of the NMOS f4, its gate is electrically connected to the complementary output node NQ, and its drain is connected to the output node Q.

The low potential power source Vbb is supplied to the source of the NMOS f9, and its gate and drain are mutually short-circuited.

The low potential power source Vbb is supplied to the source of the NMOS f10, its gate is electrically connected to the gate of the NMOS f9, and its drain is electrically connected to the output node Q.

The low potential power source Vbb is supplied to the source of the NMOS f11, and its gate and drain are mutually short-circuited.

The low potential power source Vbb is supplied to the source of the NMOS f12, its gate is electrically connected to the gate of the NMOS f11, and its drain is electrically connected to the complementary output node NQ.

The high potential power source vdd is supplied to the source of the PMOS f5, and the input signal D is supplied to its gate.

The source of the PMOS f6 is electrically connected to the drain of the PMOS f5, its gate is electrically connected to the complementary output node NQ, and its drain is electrically connected to the drain of the NMOS f9.

The high potential power source Vdd is supplied to the source of the PMOS f7, and the complementary input signal ND is supplied to its gate.

The source of the PMOS f8 is electrically connected to the drain of the PMOS f7, its gate is electrically connected to the output node Q, and its drain is electrically connected to the drain of the NMOS f11.

Next, its basic operation will be explained.

First, as an initial state, there is assumed a condition where the potential of the input signal D is "Vdd", and the potential of the complementary input signal ND is "Vss". Under this initial state, the PMOS f1 of the level-shifting circuit is "OFF", and the PMOS f3 is "ON". Accordingly, the potential of the output node Q is "Vdd", and the potential of the complementary output node NQ is "Vbb". In the switch circuit, the PMOS f5 is "OFF", the PMOS f6 is "ON", the PMOS f7 is "ON", and the PMOS f8 is "OFF".

From this initial state, potentials of the input signals D and ND are inverted, respectively.

Then, at first, the PMOS f5 of the switch circuit is turned "ON". Here, in the initial stage of the inverse operation, the potential of the complementary output node NQ maintains approximately "Vbb", so that the PMOS f6 of the switch circuit remains "ON".

In this manner, in consequence of both the PMOS f5 and f6 being turned "ON", the PMOS f9, f10 of the current mirror circuit are turned "ON", and the current mirror circuit starts to operate. Through the operation of the current mirror circuit, the output node Q is discharged. In response to this, the NMOS f2 of the level-shifting circuit is turned "OFF".

At this time, because the PMOS f1 of the level-shifting circuit is "ON", the complementary output node NQ is charged, and the potential of the complementary output node NQ rises toward "Vdd". In response to this, the NMOS f4 of the level-shifting circuit is turned "ON" to discharge the output node Q. Because of this, the potential of node Q is lowered toward "Vbb".

Furthermore, when the potential of the output node NQ rises, and the inter-gate/source voltage |Vgs| of the PMOS f6 of the switch circuit NMOS f6 comes to a level equal to or lower than the absolute amount of the threshold of this PMOS f6, the PMOS f6 is turned "OFF" to cause the NMOS f9, f10 of the current mirror circuit to be "OFF", respectively. As a result, the operation of the current mirror circuit is stopped.

In the above explanation on the operation, assumption is made on the case of inverting the potential of the input signal D from "Vdd" to "Vss". However, in case the potential of the input signal D is inverted from "Vss" to "Vdd", the switch circuit constituted by the PMOS f7, f8 is turned "ON" to operate the current mirror circuit constituted by the NMOS f11, f12 to discharge the complementary output node NQ to "Vbb". And, when the potential of the output node Q rises, and the inter-gate/source voltage |Vgs| of the PMOS f8 of the switch circuit NMOS f8 comes to a level equal to or lower than the absolute amount of the threshold of this PMOS f8, the PMOS f8 is turned "OFF" to stop the operation of the current mirror circuit constituted by the NMOS f11, f12.

In the level-shifting circuit according to the third embodiment described above, in the initial stage of the inverse operation, by the current mirror circuit, the output node Q or complementary output node NQ is discharged. By doing so, the NMOS f2 or f4 of the level-shifting circuit is caused to turn "OFF". Therefore, the maximum voltage ratio "(Vbb−Vss)/(Vdd−Vss)" of the output voltage amplitude to the input voltage amplitude where the operation can be made sufficiently is larger than a conventional level-shifting circuit.

Furthermore, in the current mirror circuit, after inversion of the potentials of the output node Q and the complementary output node NQ, respectively, the operation is stopped by the switch circuit. As a result, the current consumption at the current mirror can be suppressed.

Figure 6:
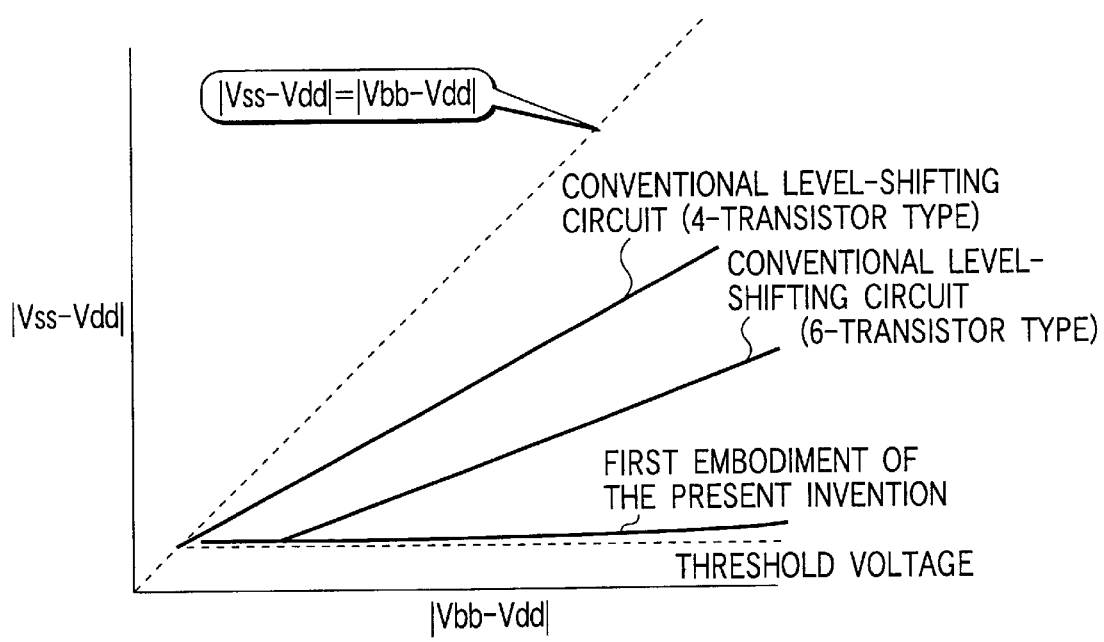
FIG. 6 is a graph showing a level-shifting circuit according to the third embodiment of the invention.
Figure 26:
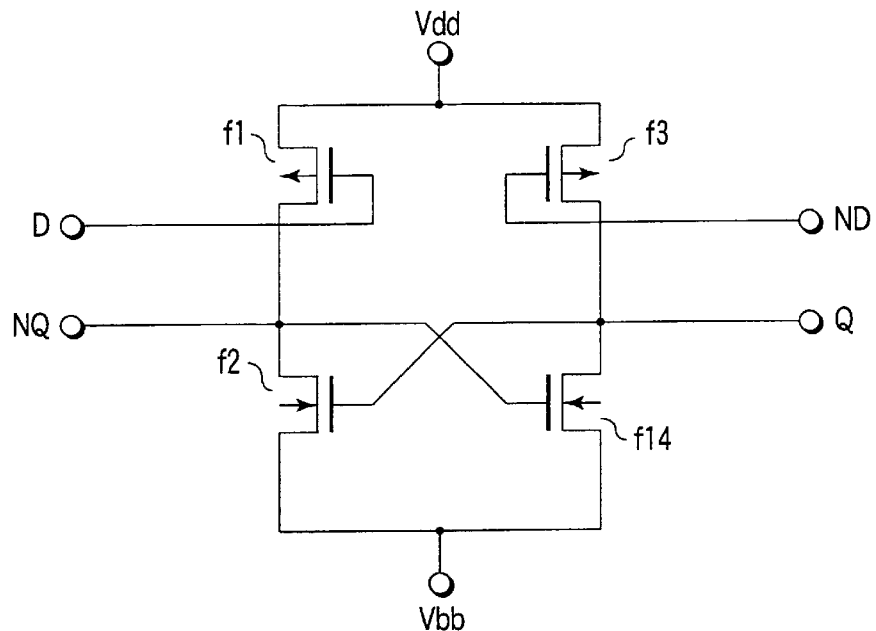
FIG. 26 is a circuit diagram showing the conventional level-shifting circuit (4-transistor type)
Figure 27:
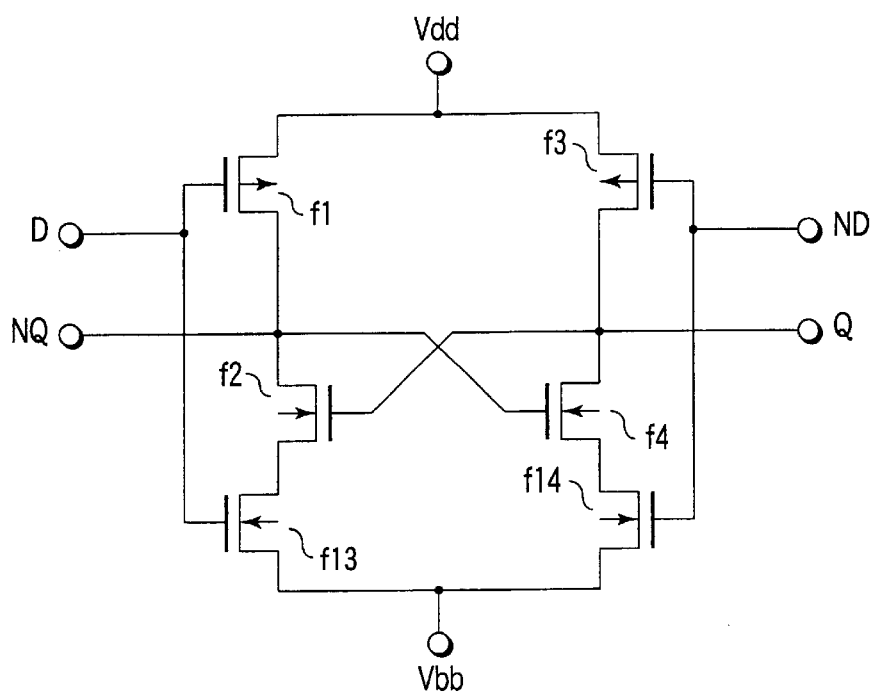
FIG. 27 is a circuit diagram showing the conventional level-shifting circuit (6-transistor type).

FIG. 6 is a graph showing by comparison the minimum input amplitude of the level-shifting circuit according to the third embodiment of the invention with the minimum input amplitude of a conventional level-shifting circuit shown in FIG. 26 (4-transistor type), and conventional level-shifting circuit shown in FIG. 27 (6-transistor type).

As shown in FIG. 6, in the level-shifting circuit of the invention, even when the input voltage amplitude is lowered to a level near the absolute value of thresholds of the PMOS f1, f3, the operation can be made sufficiently.

(Fourth Embodiment)

Figure 7:
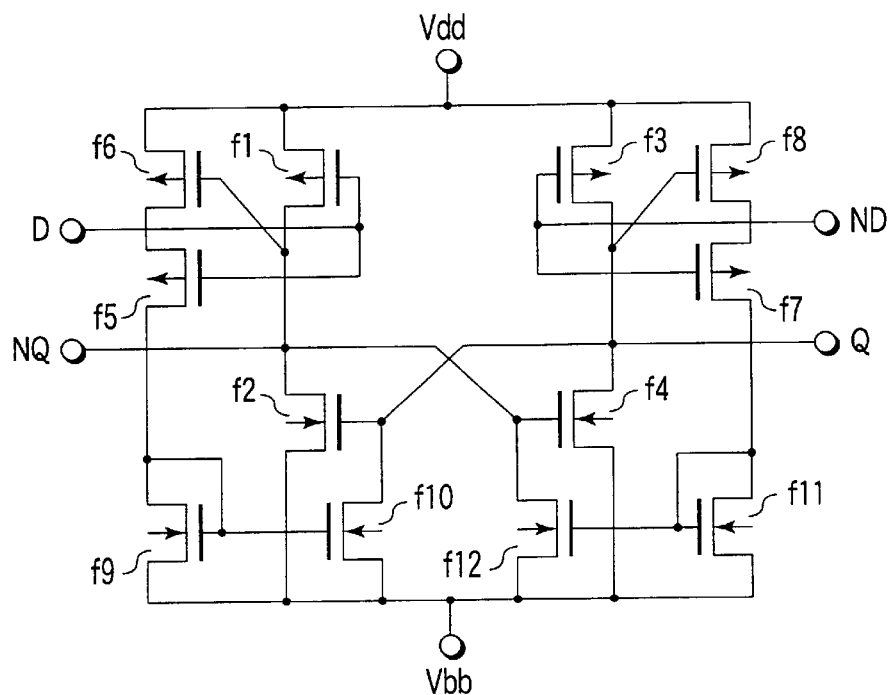
FIG. 7 is a circuit diagram showing a level-shifting circuit according to a fourth embodiment of the invention.

FIG. 7 is a circuit diagram showing a level-shifting circuit according to the fourth embodiment of the invention.

As shown in FIG. 7, the difference of the fourth embodiment from the third embodiment shown in FIG. 5 is in the connecting condition of PMOS f5, f6, f7 and f8. In the third embodiment, the PMOS f5, f7 are connected to the high potential power source Vdd side, but, as shown in this fourth embodiment, the PMOS f6, f8 may be connected to the high potential power source Vdd side.

In the fourth embodiment, there can be obtained the same effects as those of the third embodiment.

(Fifth Embodiment)

Figure 8:
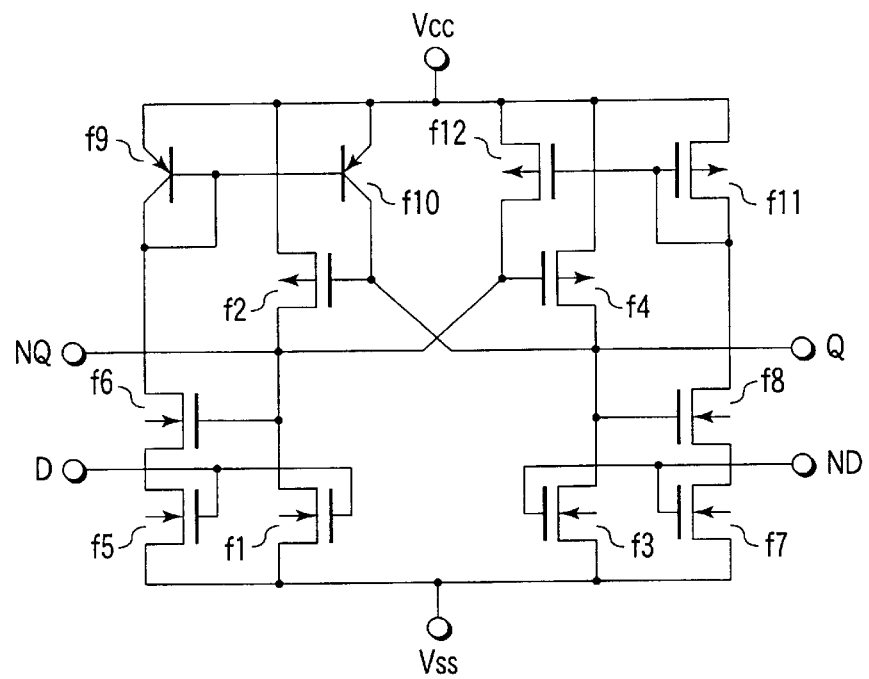
FIG. 8 is a circuit diagram showing a level-shifting circuit according to a fifth embodiment of the invention.

FIG. 8 is a circuit diagram showing a level-shifting circuit according to the fifth embodiment of the invention.

As shown in FIG. 8, the fifth embodiment is different from the first embodiment shown in FIG. 1 in that the PMOS f9, f10 are of the PNP bipolar transistors.

In case the PMOS f9, f10 are of the PNP bipolar transistors, there can be expected such effects that, for example, the driving capacity of the current mirror circuit is improved, and the charge capacity of the output node Q is improved.

(Sixth Embodiment)

Figure 9:
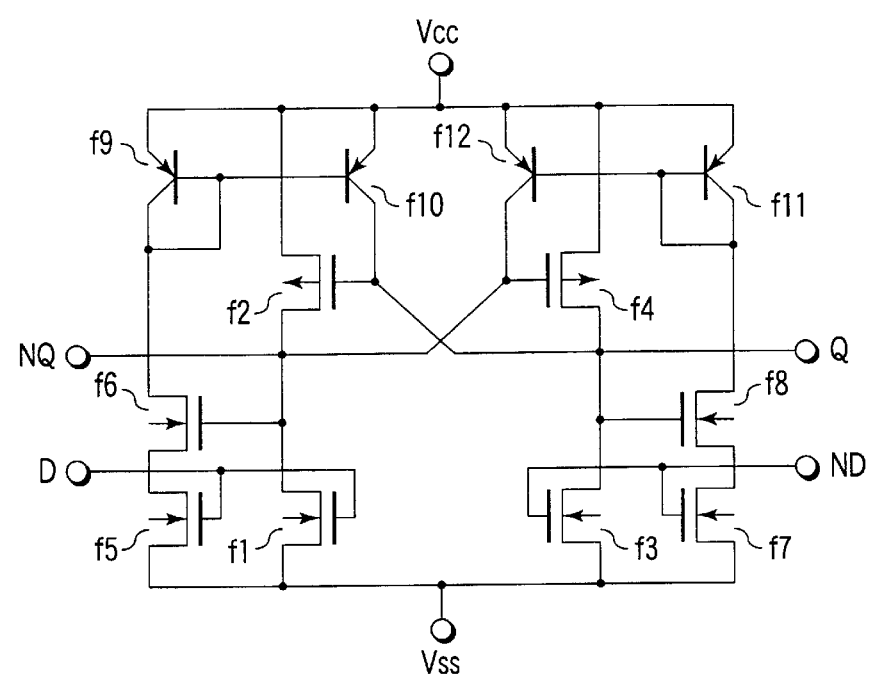
FIG. 9 is a circuit diagram showing a level-shifting circuit according to a sixth embodiment of the invention.

FIG. 9 is a circuit diagram showing a level-shifting circuit according to the sixth embodiment of the invention.

As shown in FIG. 9, the sixth embodiment is different from the first embodiment shown in FIG. 1 in that the PMOS f9, f10, f11 and f12 are of the PNP bipolar transistors.

In this case as well, in the same manner as in the fifth embodiment, there can be expected such effects that, for example, the driving capacity of the current mirror circuit is improved, and the charge capacities of the output node Q and complementary output node NQ are improved.

(Seventh Embodiment)

FIG. 10 is a circuit diagram showing a level-shifting circuit according to the seventh embodiment of the invention.

As shown in FIG. 10, the seventh embodiment is different from the third embodiment shown in FIG. 5 in that the NMOS f9, f10 are of the NPN bipolar transistors.

In case the NMOS f9, f10 are of the NPN bipolar transistors, there can be expected such effects that, for example, the driving capacity of the current mirror circuit is improved, and the discharge capacity of the output node Q is improved.

(Eighth Embodiment)

FIG. 11 is a circuit diagram showing a level-shifting circuit according to the eighth embodiment of the invention.

As shown in FIG. 11, the eighth embodiment is different from the third embodiment shown in FIG. 5 in that the NMOS f9, f10, f11, and f12 are of the NPN bipolar transistors.

In this case as well, in the same manner as in the seventh embodiment, there can be expected such effects that, for example, the driving capacity of the current mirror circuit is improved, and the discharge capacities of the output node Q and complementary output node NQ are improved.

(Ninth Embodiment)

FIG. 12 is a circuit diagram showing a level-shifting circuit according to the ninth embodiment of the invention.

As shown in FIG. 12, the ninth embodiment is different from the second embodiment shown in FIG. 4 in that the NMOS f9, f10 are of the PNP bipolar transistors. This modification is of course acceptable.

(Tenth Embodiment)

FIG. 13 is a circuit diagram showing a level-shifting circuit according to the tenth embodiment of the invention.

As shown in FIG. 13, the tenth embodiment is different from the second embodiment shown in FIG. 4 in that PMOS f9, f10, f1, and f12 are of the PNP bipolar transistors. This modification is of course acceptable.

(Eleventh Embodiment)

Figure 14:
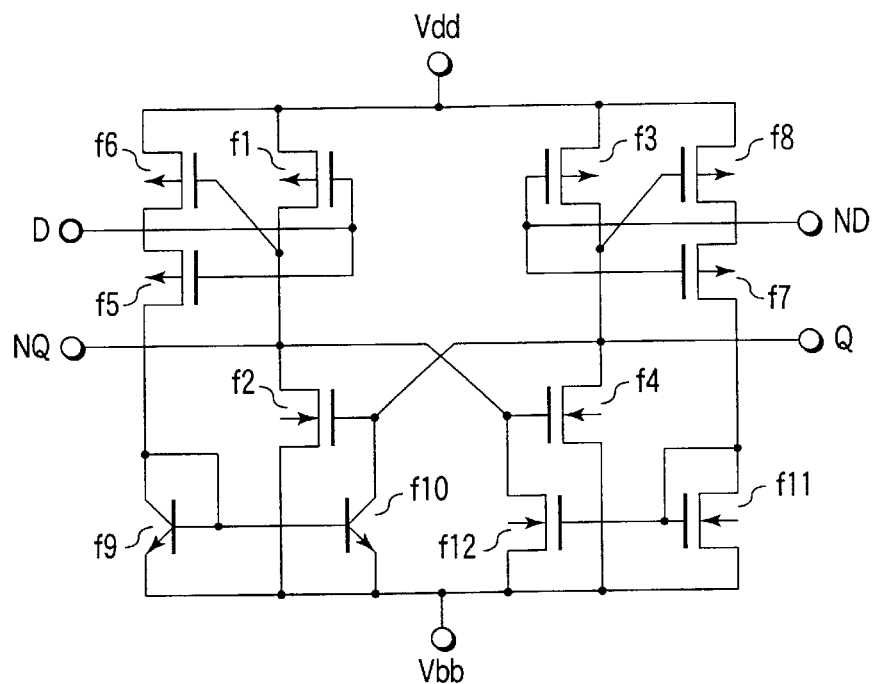
FIG. 14 is a circuit diagram showing a level-shifting circuit according to an eleventh embodiment of the invention.

FIG. 14 is a circuit diagram showing a level-shifting circuit according to an eleventh embodiment of the invention.

As shown in FIG. 14, the eleventh embodiment is different from the fourth embodiment shown in FIG. 7 in that the NMOS f9, f10 are of the NPN bipolar transistors. This modification is of course acceptable.

(Twelfth Embodiment)

Figure 15:
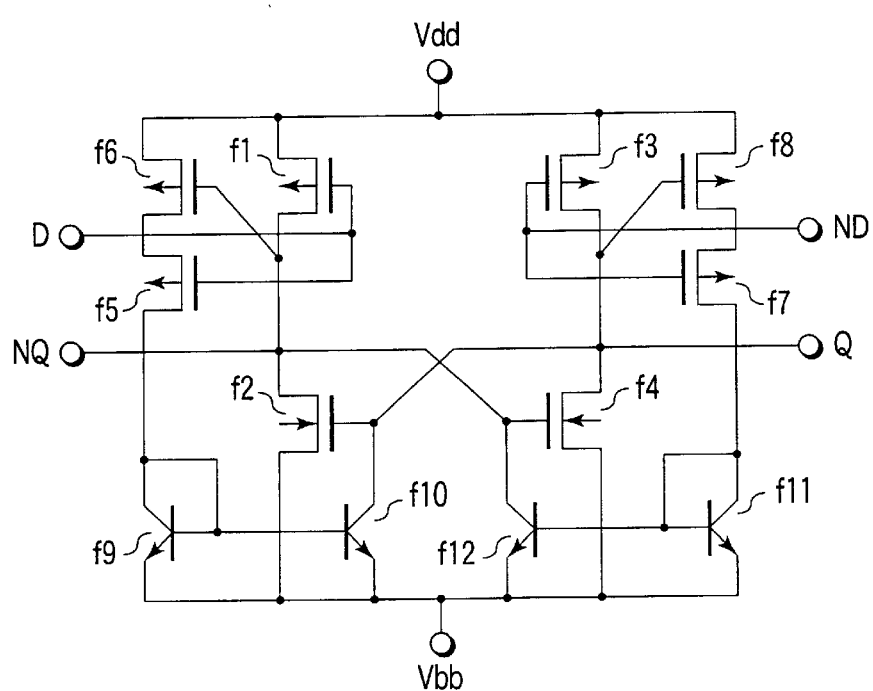
FIG. 15 is a circuit diagram showing a level-shifting circuit according to a twelfth embodiment of the invention.

FIG. 15 is a circuit diagram showing a level-shifting circuit according to the twelfth embodiment of the invention.

As shown in FIG. 15, the twelfth embodiment is different from the fourth embodiment shown in FIG. 7 in that the NMOS f9, f10, f11, and f12 are of the NPN bipolar transistors. This modification is of course acceptable.

(Thirteenth Embodiment)

FIG. 16 is a circuit diagram showing a level-shifting circuit according to the thirteenth embodiment of the invention.

As shown in FIG. 16, the difference of the thirteenth embodiment from the first embodiment shown in FIG. 1 is in the connecting condition of the NMOS f5, f6. In the first embodiment, the NMOS f5 is connected to the low potential power source Vss side, but, as shown in this thirteenth embodiment, the NMOS f6 may be connected to the low potential power source Vss side.

(Fourteenth Embodiment)

FIG. 17 is a circuit diagram showing a level-shifting circuit according to the fourteenth embodiment of the invention.

As shown in FIG. 17, the fourteenth embodiment is different from the thirteenth embodiment shown in FIG. 16 in that the PMOS f9, f10 are of the PNP bipolar transistors. This modification is of course acceptable.

(Fifteenth Embodiment)

FIG. 18 is a circuit diagram showing a level-shifting circuit according to the fifteenth embodiment of the invention.

As shown in FIG. 18, the fifteenth embodiment is different from the thirteenth embodiment shown in FIG. 16 in that the PMOS f11, f12 are of the PNP bipolar transistors. This modification is of course acceptable.

(Sixteenth Embodiment)

FIG. 19 is a circuit diagram showing a level-shifting circuit according to the sixteenth embodiment of the invention.

As shown in FIG. 19, the sixteenth embodiment is different from the thirteenth embodiment shown in FIG. 16 in that the PMOS f9, f10, f11, and f12 are of the PNP bipolar transistors. This modification is of course acceptable.

(Seventeenth Embodiment)

Figure 20:
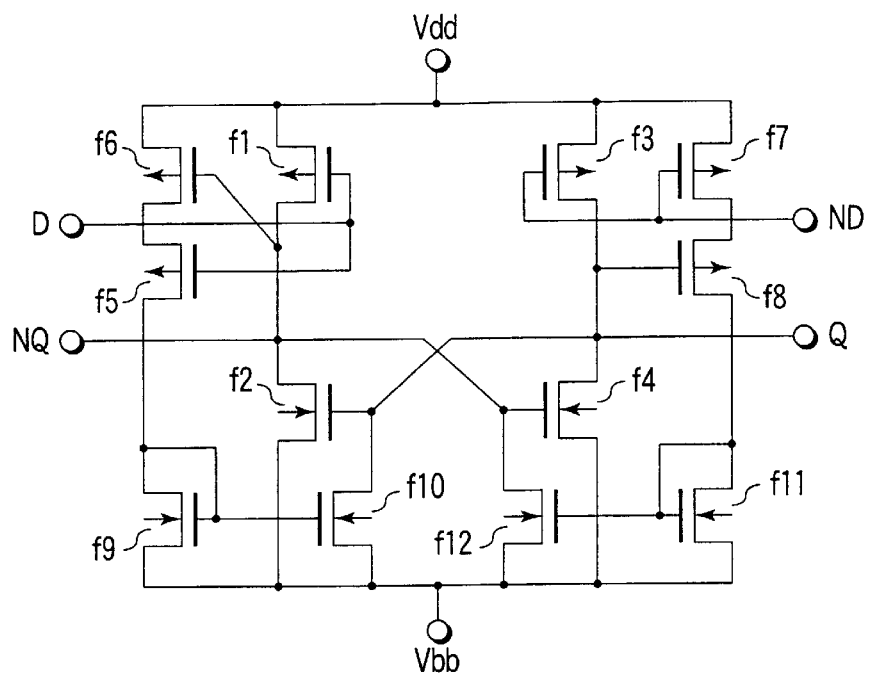
FIG. 20 is a circuit diagram showing a level-shifting circuit according to a seventeenth embodiment of the invention.

FIG. 20 is a circuit diagram showing a level-shifting circuit according to the seventeenth embodiment of the invention.

As shown in FIG. 20, the difference of the seventeenth embodiment from the third embodiment shown in FIG. 5 is in the connecting condition of the PMOS f5, f6. In the third embodiment, the PMOS f5 is connected to the high potential power source Vcc side, but, as shown in this seventeenth embodiment, the PMOS f6 may be connected to the high potential power source Vcc side.

(Eighteenth Embodiment)

Figure 21:
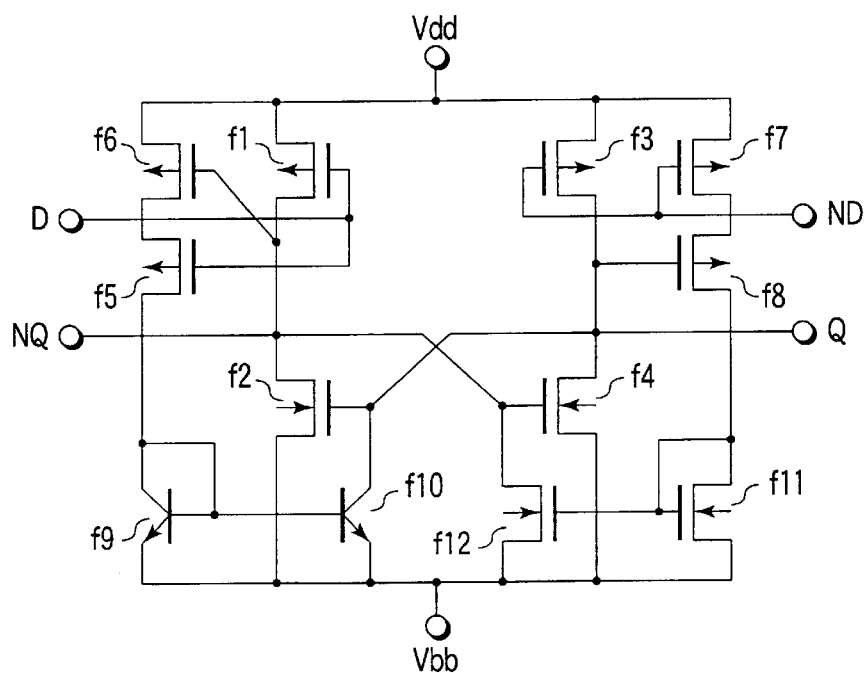
FIG. 21 is a circuit diagram showing a level-shifting circuit according to an eighteenth embodiment of the invention.

FIG. 21 is a circuit diagram showing a level-shifting circuit according to the eighteenth embodiment of the invention.

As shown in FIG. 21, the eighteenth embodiment is different from the seventeenth embodiment shown in FIG. 20 in that the NMOS f9, f10 are of the NPN bipolar transistors. This modification is of course acceptable.

(Nineteenth Embodiment)

FIG. 22 is a circuit diagram showing a level-shifting circuit according to the nineteenth embodiment of the invention.

As shown in FIG. 22, the nineteenth embodiment is different from the seventeenth embodiment shown in FIG. 20 in that the NMOS f11, f12 are of the NPN bipolar transistors. This modification is of course acceptable.

(Twentieth Embodiment)

FIG. 23 is a circuit diagram showing a level-shifting circuit according to the twentieth embodiment of the invention.

As shown in FIG. 23, the twentieth embodiment is different from the seventeenth embodiment shown in FIG. 20 in that the NMOS f9, f10, f11, and f12 are of the NPN bipolar transistors. This modification is of course acceptable.

As described above, this invention has been explained by way of the first to twentieth embodiments, but this invention is not limited to those embodiments. In the practice of the invention, various modifications are applicable within the range without departing from the purport of the invention.

For example, in the foregoing embodiment, there is shown an example of changing the transistors constituting the current mirror circuit from the insulating gate type FET, e.g., MOSFET, to the bipolar transistor. However, change of another transistor to the bipolar transistor is also possible. Especially, it is useful to change the transistors f1, f3 of the level-shifting circuit and transistors f5, f7 of the switch circuit which require especially sufficient driving capacities to the bipolar transistors. This is because, by improving the driving capacities of these transistors f1, f3, f5, and f7, even when the voltage Vdd prior to the level shift is lowered, advantageous actions are given to the attainment of the object to operate the level-shifting circuit sufficiently.

It is of course possible to practice the embodiments given above either solely or in appropriate combination.

Furthermore, the above embodiments include the inventions of various stages, and it is possible to extract the inventions of various stages by appropriate combinations of plural constituting conditions disclosed in each embodiment.

Additional advantages and modifications will readily occur to those skilled in the art. Therefore, the invention in its broader aspects is not limited to the specific details and representative embodiments shown and described herein. Accordingly, various modifications may be made without departing from the sprit or scope of the general inventive concept as defined by the appended clams and their equivalents.

What is claimed is:

1. A semiconductor integrated circuit device comprising:
   a level-shifting circuit configured to level-shift an input signal having a first amplitude to an output signal having a second amplitude different from the first amplitude, the level-shifting circuit having an input node in which the input signal is inputted and an output node in which the output signal is outputted;
   a current mirror circuit configured to charge or discharge the output node; and
   a switch circuit configured to operate the current mirror circuit during a period from the inversion of the input signal to the inversion of the output signal, the switch circuit comprising,
      a first switch to be turned ON by detecting the inversion of the input signal and
      a second switch to be turned OFF by detecting the inversion of the output signal.

2. The device according to claim 1, wherein a delayed input signal in which the input signal is delayed is inputted in the input node.

3. A semiconductor integrated circuit device comprising:
   a level-shifting circuit configured to level-shift an input signal having the first amplitude to an output signal having a second amplitude different from the first amplitude, the level-shifting circuit having a input node in which the input signal is inputted, a complementary input node in which a complementary input signal complementary to the input signal is inputted, an output node in which the output signal is outputted, and a complementary output node in which a complementary output signal complementary to the output signal is outputted;
   a first current mirror circuit configured to charge or discharge the output node;
   a second current mirror configured to charge or discharge the complementary output node;
   a first switch circuit configured to operate the first current mirror circuit during a period from the inversion of the input signal to the inversion of the complementary output signal, the first switch circuit comprising,
      a first switch to be turned ON by detecting the inversion of the input signal; and
      a second switch to be turned OFF by detecting the inversion of the complementary output signal; and
   a second switch circuit configured to operate complementarily to the first switch circuit, and causing to operate the second current mirror circuit during a period from the inversion of the complementary input signal to the inversion of the output signal, the second switch circuit comprising,
      a third switch to be turned ON after inversion of the complementary input signal and
      a fourth switch to be turned OFF after inversion of the output signal.

4. The device according to claim 3, wherein a delayed input signal obtained by delaying the input signal is inputted to the input node, and a delayed complementary input signal obtained by delaying the complementary input signal is inputted to the complementary input node.

5. A semiconductor integrated circuit device comprising:

a first transistor of a first conductive type having a first electrode, a second electrode electrically connected to a first output node, and a control electrode, the first transistor receives a first potential in the first electrode, an input signal having a potential difference between the first potential and a second potential different from the first potential or a delayed input signal in which the input signal is delayed in the control electrode;

a second transistor of the first conductive type having a first electrode, a second electrode electrically connected to a second output node, and a control electrode, the second transistor receives the first potential in the first electrode, a complementary input signal complementary to the input signal or a complementary delayed input signal complementary to the delayed input signal;

a third transistor of a second conductive type having a first electrode, a second electrode electrically connected to the second output node, and a control electrode electrically connected to the first output node, the third transistor receives a third potential different from the second potential in the first electrode;

a fourth transistor of the second conductive type having a first electrode, a second electrode electrically connected to the first output node, and a control electrode electrically connected to the second output node, the fourth transistor receives the third potential in the first electrode;

a fifth transistor of the second conductive type having a first electrode, a second electrode, and a control electrode electrically connected to the second electrode of the fifth transistor, the fifth transistor receives the third potential in the first transistor;

a sixth transistor of the second conductive type having a first electrode, a second electrode electrically connected to the second output node, and a control electrode electrically connected to the control gate electrode of the fifth transistor, the sixth transistor receives the third potential in the first transistor;

a seventh transistor of the second conductive type having a first electrode, a second electrode, and a control electrode electrically connected to the second electrode of the seventh transistor, the seventh transistor receives the third potential in the first transistor;

a eighth transistor of the second conductive type having a first electrode, a second electrode electrically connected to the first output node, and a control electrode electrically connected to the control gate electrode of the seventh transistor, the eighth transistor receives the third potential in the first transistor;

ninth and tenth transistors of the first conductive type series-connected between the first potential and the second electrode of the fifth transistors, the ninth transistor receives the input signal or the delayed input signal in the control gate, the tenth transistor receives a potential of the first output node in the control gate; and eleventh and twelfth transistors of the first conductive type series-connected between the first potential and the second electrode of the seventh transistors, the eleventh transistor receives the complementary input signal or the complementary delayed input signal in the control gate, the twelfth transistor receives a potential of the second output node in the control gate.

6. The device according to claim 5, wherein the first to twelfth transistors are the insulating gate type FET.

7. The device according to claim 5, wherein at least one of a pair of the fifth and sixth transistors and a pair of the seventh and eighth transistors, or both pairs, are bipolar transistors.

8. The device according to claim 5, wherein at least one of the first, second, ninth, and eleventh transistors is a bipolar transistor.

9. The device according to claim 7, wherein at least one of the first, second, ninth, and eleventh transistors is a bipolar transistor.

10. The device according to claim 5, wherein at least one of the tenth and twelfth transistors is a bipolar transistor.

11. The device according to claim 7, wherein at least one of the tenth and twelfth transistors is a bipolar transistor.

12. The device according to claim 8, wherein at least one of the tenth and twelfth transistors is a bipolar transistor.

13. The device according to claim 9, wherein at least one of the tenth and twelfth transistors is a bipolar transistor.

14. The device according to claim 5, wherein the delay time of the delayed input signal is larger for the case of changing from the first potential to the second potential than for the case of changing from the second potential to the first potential.

* * * * *